(12) United States Patent
Saito

(10) Patent No.: US 10,123,421 B2
(45) Date of Patent: Nov. 6, 2018

(54) CAPACITOR MOUNTING STRUCTURE

(71) Applicant: TAIYO YUDEN CO., LTD., Taito-ku, Tokyo (JP)

(72) Inventor: Kenji Saito, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 26 days.

(21) Appl. No.: 15/485,126

(22) Filed: Apr. 11, 2017

(65) Prior Publication Data

US 2017/0301474 A1 Oct. 19, 2017

(30) Foreign Application Priority Data

Apr. 14, 2016 (JP) .................. 2016-080850

(51) Int. Cl.
*H05K 1/18* (2006.01)
*H01G 4/228* (2006.01)
*H01G 4/30* (2006.01)
*H01G 4/38* (2006.01)

(52) U.S. Cl.
CPC ............. *H05K 1/181* (2013.01); *H01G 4/228* (2013.01); *H01G 4/30* (2013.01); *H01G 4/38* (2013.01); *H05K 2201/09236* (2013.01); *H05K 2201/10015* (2013.01); *H05K 2201/10522* (2013.01); *H05K 2201/10545* (2013.01)

(58) Field of Classification Search
CPC ...................................................... H05K 1/181
See application file for complete search history.

(56) References Cited

U.S. PATENT DOCUMENTS

| 6,754,064 | B2* | 6/2004 | Azuma ................. | H01G 2/065 361/302 |
| 2015/0014040 | A1* | 1/2015 | Ahn ....................... | H01G 4/30 174/260 |
| 2015/0364261 | A1* | 12/2015 | Takahashi ............... | H01G 4/06 361/301.4 |
| 2016/0322951 | A1* | 11/2016 | Kanezaki ............. | H03H 1/0007 |

FOREIGN PATENT DOCUMENTS

JP 2013251495 A 12/2013

* cited by examiner

*Primary Examiner* — Jeremy C Norris
(74) *Attorney, Agent, or Firm* — Law Office of Katsuhiro Arai

(57) ABSTRACT

In an embodiment, with a capacitor mounting structure 200, series-connected first multilayer capacitor 211 and second multilayer capacitor 212 are placed in such a way that signals flow through them in the opposite directions, respectively. In addition, the series-connected first multilayer capacitor 211 and second multilayer capacitor 212 are placed in such a way that their respective internal electrode layers 211c, 212c face each other. The capacitor mounting structure can prevent the overall ESL value from increasing even when multilayer capacitors are connected in series.

7 Claims, 5 Drawing Sheets

| IN100 (mm) | ESL (dB) | | | | | | |
|---|---|---|---|---|---|---|---|
| | 0603 | 1005 | 1608 | 2012 | 3216 | 3225 | 4532 |
| 0.1 | 0.29 | 0.44 | 0.69 | 0.71 | 1.45 | 1.07 | 1.82 |
| 0.2 | 0.38 | 0.54 | 0.78 | 0.80 | 1.54 | 1.16 | 1.91 |
| 0.3 | 0.48 | 0.63 | 0.88 | 0.89 | 1.63 | 1.26 | 2.01 |
| 0.4 | 0.57 | 0.72 | 0.97 | 0.98 | 1.72 | 1.35 | 2.10 |
| 0.5 | 0.66 | 0.81 | 1.06 | 1.08 | 1.81 | 1.44 | 2.19 |
| 0.6 | 0.75 | 0.90 | 1.15 | 1.17 | 1.91 | 1.53 | 2.28 |
| 0.7 | 0.84 | 1.00 | 1.24 | 1.26 | 2.00 | 1.62 | 2.37 |
| 0.8 | 0.94 | 1.09 | 1.34 | 1.35 | 2.09 | 1.72 | 2.47 |
| 0.9 | 1.03 | 1.18 | 1.43 | 1.44 | 2.18 | 1.81 | 2.56 |
| 1.0 | 1.12 | 1.27 | 1.52 | 1.54 | 2.27 | 1.90 | 2.65 |
| 1.2 | 1.30 | 1.46 | 1.70 | 1.72 | 2.46 | 2.08 | 2.83 |
| 1.4 | 1.49 | 1.64 | 1.89 | 1.90 | 2.64 | 2.27 | 3.02 |
| 1.6 | 1.67 | 1.82 | 2.07 | 2.09 | 2.83 | 2.45 | 3.20 |
| 1.8 | 1.86 | 2.01 | 2.26 | 2.27 | 3.01 | 2.64 | 3.39 |
| 2.0 | 2.04 | 2.19 | 2.44 | 2.46 | 3.19 | 2.82 | 3.57 |
| 3.0 | 2.96 | 3.11 | 3.36 | 3.38 | 4.11 | 3.74 | 4.49 |
| 4.0 | 3.88 | 4.03 | 4.28 | 4.30 | 5.03 | 4.66 | 5.41 |
| 5.0 | 4.80 | 4.95 | 5.20 | 5.22 | 5.95 | 5.58 | 6.33 |
| 6.0 | 5.72 | 5.87 | 6.12 | 6.14 | 6.87 | 6.50 | 7.25 |
| 7.0 | 6.64 | 6.79 | 7.04 | 7.06 | 7.79 | 7.42 | 8.17 |
| 8.0 | 7.56 | 7.71 | 7.96 | 7.98 | 8.71 | 8.34 | 9.09 |
| 9.0 | 8.48 | 8.63 | 8.88 | 8.90 | 9.63 | 9.26 | 10.01 |
| 10.0 | 9.40 | 9.55 | 9.80 | 9.82 | 10.55 | 10.18 | 10.93 |

| IN200 (mm) | ESL (nH) | | | | | | |
|---|---|---|---|---|---|---|---|
| | 0603 | 1005 | 1608 | 2012 | 3216 | 3225 | 4532 |
| 0.1 | 0.07 | 0.09 | 0.14 | 0.14 | 0.24 | 0.18 | 0.30 |
| 0.2 | 0.11 | 0.12 | 0.16 | 0.16 | 0.26 | 0.19 | 0.32 |
| 0.3 | 0.14 | 0.15 | 0.17 | 0.18 | 0.27 | 0.21 | 0.33 |
| 0.4 | 0.17 | 0.18 | 0.20 | 0.20 | 0.30 | 0.23 | 0.37 |
| 0.5 | 0.24 | 0.21 | 0.24 | 0.34 | 0.34 | 0.27 | 0.41 |
| 0.6 | 0.31 | 0.26 | 0.27 | 0.27 | 0.41 | 0.33 | 0.49 |
| 0.7 | 0.42 | 0.29 | 0.31 | 0.27 | 0.44 | 0.36 | 0.54 |
| 0.8 | 0.49 | 0.34 | 0.35 | 0.30 | 0.50 | 0.41 | 0.62 |
| 0.9 | 0.57 | 0.39 | 0.40 | 0.33 | 0.55 | 0.45 | 0.67 |
| 1.0 | 0.70 | 0.53 | 0.45 | 0.37 | 0.60 | 0.50 | 0.76 |
| 1.2 | 0.87 | 0.73 | 0.57 | 0.49 | 0.77 | 0.65 | 0.80 |
| 1.4 | 1.06 | 0.96 | 0.70 | 0.63 | 0.98 | 0.76 | 0.94 |
| 1.6 | 1.29 | 1.30 | 0.90 | 0.72 | 0.97 | 0.88 | 1.03 |
| 1.8 | 1.55 | 1.67 | 1.19 | 0.81 | 1.08 | 0.94 | 1.13 |
| 2.0 | 1.85 | 1.83 | 1.63 | 0.98 | 1.18 | 1.08 | 1.23 |
| 3.0 | 2.69 | 2.83 | 3.05 | 1.58 | 1.65 | 1.56 | 1.86 |
| 4.0 | 3.88 | 4.03 | 4.28 | 3.30 | 2.96 | 2.74 | 3.16 |
| 5.0 | 4.80 | 4.95 | 5.20 | 4.74 | 5.41 | 5.07 | 3.52 |
| 6.0 | 5.72 | 5.87 | 6.12 | 6.14 | 6.87 | 6.50 | 6.59 |
| 7.0 | 6.64 | 6.79 | 7.04 | 7.06 | 7.79 | 7.42 | 8.17 |
| 8.0 | 7.56 | 7.71 | 7.96 | 7.98 | 8.71 | 8.34 | 9.09 |
| 9.0 | 8.48 | 8.63 | 8.83 | 8.90 | 9.63 | 9.26 | 10.01 |
| 10.0 | 9.40 | 9.55 | 9.80 | 9.82 | 10.55 | 10.18 | 10.93 |

| IN300 (mm) | ESL (nH) | | | | | | |
|---|---|---|---|---|---|---|---|
| | 0603 | 1005 | 1608 | 2012 | 3216 | 3225 | 4532 |
| 0.1 | 0.07 | 0.09 | 0.14 | 0.14 | 0.24 | 0.18 | 0.30 |
| 0.2 | 0.11 | 0.12 | 0.16 | 0.16 | 0.26 | 0.19 | 0.32 |
| 0.3 | 0.14 | 0.15 | 0.17 | 0.18 | 0.27 | 0.21 | 0.33 |
| 0.4 | 0.17 | 0.18 | 0.20 | 0.20 | 0.30 | 0.23 | 0.37 |
| 0.5 | 0.24 | 0.21 | 0.24 | 0.24 | 0.34 | 0.27 | 0.41 |
| 0.6 | 0.31 | 0.26 | 0.27 | 0.27 | 0.41 | 0.33 | 0.49 |
| 0.7 | 0.42 | 0.29 | 0.31 | 0.27 | 0.44 | 0.36 | 0.54 |
| 0.8 | 0.49 | 0.34 | 0.35 | 0.30 | 0.50 | 0.41 | 0.62 |
| 0.9 | 0.57 | 0.39 | 0.40 | 0.33 | 0.55 | 0.45 | 0.67 |
| 1.0 | 0.70 | 0.53 | 0.45 | 0.37 | 0.60 | 0.50 | 0.76 |
| 1.2 | 0.87 | 0.73 | 0.57 | 0.49 | 0.77 | 0.65 | 0.86 |
| 1.4 | 1.06 | 0.96 | 0.70 | 0.63 | 0.88 | 0.76 | 0.94 |
| 1.6 | 1.29 | 1.30 | 0.90 | 0.72 | 0.97 | 0.85 | 1.03 |
| 1.8 | 1.55 | 1.67 | 1.19 | 0.81 | 1.08 | 0.94 | 1.13 |
| 2.0 | 1.85 | 1.83 | 1.63 | 0.98 | 1.18 | 1.08 | 1.23 |
| 3.0 | 2.69 | 2.83 | 3.05 | 1.88 | 1.65 | 1.56 | 1.56 |
| 4.0 | 3.88 | 4.03 | 4.28 | 3.30 | 2.96 | 2.71 | 2.16 |
| 5.0 | 4.80 | 4.95 | 5.20 | 4.74 | 5.41 | 5.07 | 3.52 |
| 6.0 | 5.72 | 5.87 | 6.12 | 6.14 | 6.87 | 6.50 | 6.59 |
| 7.0 | 6.64 | 6.79 | 7.04 | 7.06 | 7.79 | 7.42 | 8.17 |
| 8.0 | 7.56 | 7.71 | 7.96 | 7.98 | 8.71 | 8.34 | 9.09 |
| 9.0 | 8.48 | 8.63 | 8.88 | 8.90 | 9.63 | 9.26 | 10.01 |
| 10.0 | 9.40 | 9.55 | 9.80 | 9.82 | 10.55 | 10.18 | 10.93 | under series connection.

CAPACITOR MOUNTING STRUCTURE

BACKGROUND

Field of the Invention

The present invention relates to a capacitor mounting structure constituted by multiple multilayer capacitors mounted on a circuit board under series connection.

Description of the Related Art

When mounting multilayer capacitors on a circuit board, multiple multilayer capacitors may be connected in series for the purpose of reducing the load, etc. (refer to Patent Literature 1, for example).

FIG. 1 shows a conventional capacitor mounting structure 100 constituted by two multilayer capacitors 111, 112 of the same specification mounted on a circuit board 121 under series connection.

The first multilayer capacitor 111 has external electrodes 111a, 111b on the opposing ends, respectively, with parts of multiple internal electrode layers 111c built into the capacitor body (not accompanied by symbol) connected to one external electrode 111a, and the remaining parts thereof connected to the other external electrode 111b. Also, the second multilayer capacitor 112 has external electrodes 112a, 112b on the opposing ends, respectively, with parts of multiple internal electrode layers 112c built into the capacitor body (not accompanied by symbol) connected to one external electrode 112a, and the remaining parts thereof connected to the other external electrode 112b. Provided as straight lines on one surface of the circuit board 121 are wires 122 for series connection, where these wires 122 have four pads 122a to 122d.

As shown in FIG. 1, the first multilayer capacitor 111 and second multilayer capacitor 112 have a positional relationship based on parallel displacement in the lateral direction in FIG. 1 (hereinafter the "lateral direction" refers to the right-left direction of the figure page), and the first multilayer capacitor 111 and second multilayer capacitor 112 are apart from each other by an interval IN100. The first multilayer capacitor 111 is oriented so that the internal electrode layers 111c lie roughly in parallel with one surface of the circuit board 121, and one external electrode 111a is connected to the pad 122a, while the other external electrode 111b is connected to the pad 122b. Also, the second multilayer capacitor 112 is oriented so that the internal electrode layers 112c lie roughly in parallel with one surface of the circuit board 121, and one external electrode 112a is connected to the pad 122c, while the other external electrode 112b is connected to the pad 122d. It should be noted that the aforementioned connections, for which solder or other joining material is used, are not illustrated. Also, the thick arrows in FIG. 1 indicate the flow direction of electrical signals.

In other words, the series-connected first multilayer capacitor 111 and second multilayer capacitor 112 are placed in such a way that signals flow through them in the same direction. This means that, if the series connection length that includes these multilayer capacitors 111, 112 (actual wiring length from the end face of the external electrode 111a on the first multilayer capacitor 111 to the end face of the external electrode 112b on the second multilayer capacitor 112) increases, the overall ESL (equivalent series inductance) value may increase according to the length of this series connection length and the high-frequency characteristics may drop as a result.

It should be noted that FIG. 2 shows the measured results of the ESL value relating to the capacitor mounting structure 100 shown in FIG. 1. FIG. 2 will be used in the verification of effects as described later.

BACKGROUND ART LITERATURES

[Patent Literature 1] Japanese Patent Laid-open No. 2013-251495

SUMMARY

An object of the present invention is to provide a capacitor mounting structure that can prevent the overall ESL value from increasing even when multilayer capacitors are connected in series.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the capacitor mounting structure pertaining to the present invention is a capacitor mounting structure constituted by multiple multilayer capacitors mounted on a circuit board under series connection, wherein the multiple multilayer capacitors are placed in such a way that signals flow through the adjacent multilayer capacitors in the opposite directions, respectively.

According to the capacitor mounting structure pertaining to the present invention, any increase in the overall ESL value can be prevented even when multilayer capacitors are connected in series.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

200—Capacitor mounting structure, 211—First multilayer capacitor, 211a, 211b—External electrode, 211c—Internal electrode layer, 212—Second multilayer capacitor, 212a, 212b—External electrode, 212c—Internal electrode layer, 213—Third multilayer capacitor, 213a, 213b—External electrode, 213c—Internal electrode layer, 221—Circuit board, 222—Wire, 222a to 222e—Pad, 300—Capacitor mounting structure, 311—First multilayer capacitor, 311a, 311b—External electrode, 311c—Internal electrode layer, 312—Second multilayer capacitor, 312a, 312b—External electrode, 312c—Internal electrode layer, 313—Third multilayer capacitor, 313a, 313b—External electrode, 313c—Internal electrode layer, 314—Fourth multilayer capacitor, 314a, 314b—External electrode, 314c—Internal electrode layer, 321—Circuit board, 322—Wire, 322a to 322d, 322f to 322i—Pad, 322e—Via conductor.

DETAILED DESCRIPTION OF EMBODIMENTS

Figures 3, 4:
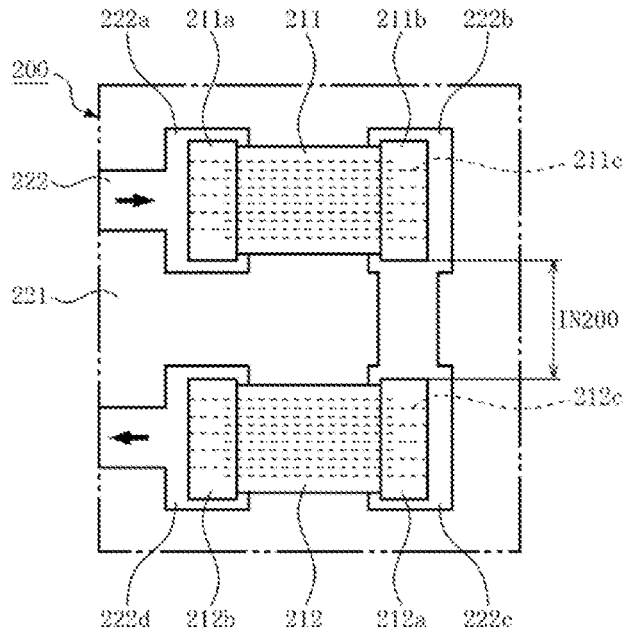
FIG. 3 is a drawing showing the capacitor mounting structure pertaining to the first embodiment of the present invention.
FIG. 4 is a table showing the measured results of ESL values pertaining to the capacitor mounting structure shown in FIG. 3.

FIG. 3 shows the capacitor mounting structure 200 pertaining to the first embodiment of the present invention, which is specifically a capacitor mounting structure 200 constituted by two multilayer capacitors 211, 212 of the same specification mounted on a circuit board 221 under series connection.

The first multilayer capacitor 211 has external electrodes 211a, 211b on the opposing ends, respectively, with parts of multiple internal electrode layers 211c built into the capacitor body (not accompanied by symbol) connected to one external electrode 211a, and the remaining parts thereof connected to the other external electrode 211b. Also, the second multilayer capacitor 212 has external electrodes 212a, 212b on the opposing ends, respectively, with parts of multiple internal electrode layers 212c built into the capacitor body (not accompanied by symbol) connected to one external electrode 212a, and the remaining parts thereof connected to the other external electrode 212b. Provided in roughly a U-shape on one surface of the circuit board 221 are wires 222 for series connection, where these wires 222 have four pads 222a to 222d.

As shown in FIG. 3, the first multilayer capacitor 211 and second multilayer capacitor 212 have a positional relationship based on parallel displacement in the vertical direction (hereinafter the "vertical direction" refers to the top-bottom direction of the figure page) in FIG. 3, and the first multilayer capacitor 211 and second multilayer capacitor 212 are apart from each other by an interval IN200. The first multilayer capacitor 211 is oriented so that the internal electrode layers 211c lie roughly at right angles with one surface of the circuit board 221, and one external electrode 211a is connected to the pad 222a, while the other external electrode 211b is connected to the pad 222b. Also, the second multilayer capacitor 212 is oriented so that the internal electrode layers 212c lie roughly at right angles with one surface of the circuit board 221, and one external electrode 212a is connected to the pad 222c, while the other external electrode 212b is connected to the pad 222d. It should be noted that the aforementioned connections, for which solder or other joining material is used, are not illustrated. Also, the thick arrows in FIG. 3 indicate the flow directions of electric signals.

In other words, the series-connected first multilayer capacitor 211 and second multilayer capacitor 212 are placed in such a way that signals flow through them in the opposite directions, respectively. In addition, the series-connected first multilayer capacitor 211 and second multilayer capacitor 212 are placed in such a way that their respective internal electrode layers 211c, 212c face each other. This means that, even when the series connection length that includes these multilayer capacitors 211, 212 (actual wiring length from the end face of the external electrode 211a on the first multilayer capacitor 211 to the end face of the external electrode 212b on the second multilayer capacitor 212) increases, mutual inductance can be reduced in an effective manner to prevent the overall ESL value from increasing.

It should be noted that FIG. 4 shows the measured results of the ESL value relating to the capacitor mounting structure 200 shown in FIG. 3. FIG. 4 will be used in the verification of effects as described later.

Figures 5, 6:
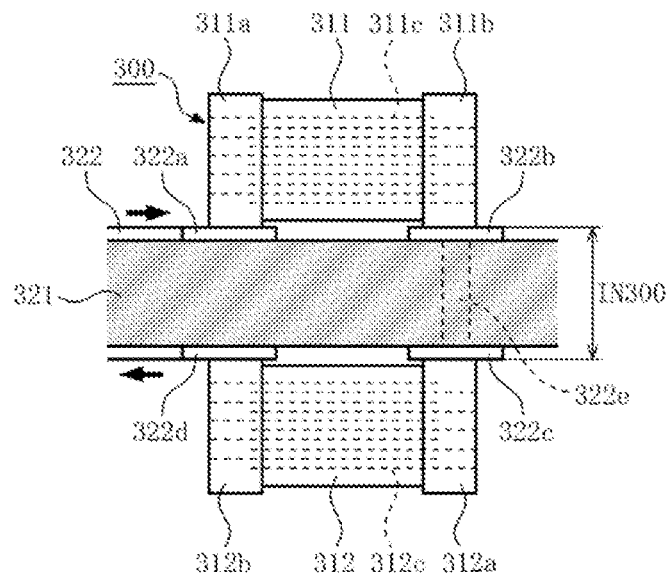
FIG. 5 is a drawing showing the capacitor mounting structure pertaining to the second embodiment of the present invention.
FIG. 6 is a table showing the measured results of ESL values pertaining to the capacitor mounting structure shown in FIG. 5.

FIG. 5 shows the capacitor mounting structure 300 pertaining to the second embodiment of the present invention, which is specifically a capacitor mounting structure 300 constituted by two multilayer capacitors 311, 312 of the same specification mounted on a circuit board 321 under series connection.

The first multilayer capacitor 311 has external electrodes 311a, 311b on the opposing ends, respectively, with parts of multiple internal electrode layers 311c built into the capacitor body (not accompanied by symbol) connected to one external electrode 311a, and the remaining parts thereof connected to the other external electrode 311b. Also, the second multilayer capacitor 312 has external electrodes 312a, 312b on the opposing ends, respectively, with parts of multiple internal electrode layers 312c built into the capacitor body (not accompanied by symbol) connected to one external electrode 312a, and the remaining parts thereof connected to the other external electrode 312b. Provided in roughly a U-shape on one side and the other side of the circuit board 321 in a manner sandwiching the circuit board 321 are wires 322 for series connection, where these wires 322 have two pads 322a, 322b on one side, two pads 322c, 322d on the other side, and a via conductor 322e that connects the pad 322b on one side and the pad 322c on the other side.

As shown in FIG. 5, the first multilayer capacitor 311 and second multilayer capacitor 312 have a positional relationship based on parallel displacement in the "vertical direction" in FIG. 5, and the first multilayer capacitor 311 and second multilayer capacitor 312 are apart from each other by an interval IN300. The first multilayer capacitor 311 is oriented so that the internal electrode layers 311c lie roughly in parallel with one surface of the circuit board 321, and one external electrode 311a is connected to the pad 322a, while the other external electrode 311b is connected to the pad 322b. Also, the second multilayer capacitor 312 is oriented so that the internal electrode layers 312c lie roughly in parallel with the other side of the circuit board 321, and one external electrode 312a is connected to the pad 322c, while the other external electrode 312b is connected to the pad 322d. It should be noted that the aforementioned connections, for which solder or other joining material is used, are not illustrated. Also, the thick arrows in FIG. 5 indicate the flow directions of signals.

In other words, the series-connected first multilayer capacitor 311 and second multilayer capacitor 312 are placed in such a way that signals flow through them in the opposite directions, respectively. In addition, the series-connected first multilayer capacitor 311 and second multilayer capacitor 312 are placed in such a way that their respective internal electrode layers 311c, 312c face each other via the board 321. This means that, even when the series connection length that includes these multilayer capacitors 311, 312 (actual wiring length from the end face of the external electrode 311a on the first multilayer capacitor 311 to the end face of the external electrode 312b on the second multilayer capacitor 312) increases, mutual inductance can be reduced in an effective manner to prevent the overall ESL value from increasing.

It should be noted that FIG. 6 shows the measured results of the ESL value relating to the capacitor mounting structure 300 shown in FIG. 5. FIG. 6 will be used in the verification of effects as described later.

The verified results of the aforementioned effect (preventing the ESL value from increasing) are explained below using FIGS. 2, 4, and 6.

<Size of Multilayer Capacitor>

Figures 1, 2:
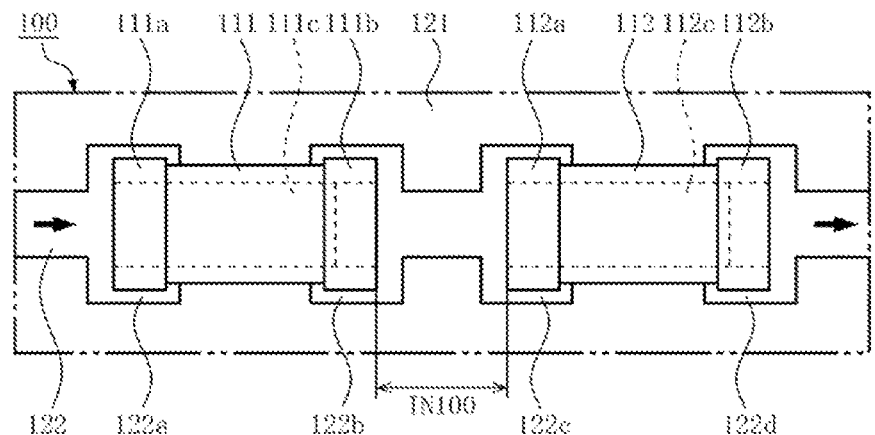
FIG. 1 is a drawing showing a conventional capacitor mounting structure.
FIG. 2 is a table showing the measured results of ESL values pertaining to the capacitor mounting structure shown in FIG. 1.

In FIGS. 2, 4, and 6, "0603" indicates a multilayer capacitor with a reference length of 0.6 mm, reference width of 0.3 mm, and reference height of 0.3 mm, "1015" indicates a multilayer capacitor with a reference length of 1.0 mm, reference width of 0.5 mm, and reference height of 0.5 mm, "1608" indicates a multilayer capacitor with a reference length of 1.6 mm, reference width of 0.8 mm, and reference height of 0.8 mm, "2012" indicates a multilayer capacitor with a reference length of 2.0 mm, reference width of 1.25 mm, and reference height of 1.25 mm, "3216" indicates a multilayer capacitor with a reference length of 3.2 mm, reference width of 1.6 mm, and reference height of 1.6 mm, "3225" indicates a multilayer capacitor with a reference length of 3.2 mm, reference width of 2.5 mm, and reference height of 2.5 mm, and "4532" indicates a multilayer capacitor with a reference length of 4.5 mm, reference width of 3.2 mm, and reference height of 2.5 mm.

<Measurement of ESL Value>

For the measurement, multilayer capacitors of the same specification, with a capacitance of 1 µF, were prepared for each of the sizes mentioned above, along with glass epoxy resin boards having copper wires corresponding to FIG. 1, glass epoxy resin boards having copper wires corresponding to FIG. 3, and glass epoxy resin boards of different thickness having copper wires corresponding to FIG. 3. Then, these were used, as deemed appropriate, to produce capacitor mounting structures of varying intervals IN100 corresponding to FIG. 1, capacitor mounting structures of varying intervals IN200 corresponding to FIG. 3, and mounting structures of varying intervals IN300 corresponding to the capacitor mounting structure 300 in FIG. 5. Then, by using the impedance analyzer E4991 manufactured by Agilent Technologies, 1.0 V of voltage and 1 to 100 mA of current were supplied to the parts of the respective mounting structures produced, corresponding to the aforementioned series connection lengths, and the generated ESL values were measured. The measured results for each size are shown in the "ESL (nH)" columns of FIGS. 2, 4 and 6.

<Verified Results>

As shown in the shaded fields of FIGS. 4 and 6, the capacitor mounting structures corresponding to FIGS. 3 and 5, which used the multilayer capacitors of sizes 0603, 1005, and 1608, did not see their ESL value increase compared to the capacitor mounting structure corresponding to FIG. 1 so long as their interval IN200 or IN300 was 3.0 mm or less. Also, the capacitor mounting structures corresponding to FIGS. 3 and 5, which used the multilayer capacitors of sizes 2012, 3216, and 3225, did not see their ESL value increase compared to the capacitor mounting structure corresponding to FIG. 1 so long as their interval IN200 or IN300 was 5.0 mm or less. Furthermore, the capacitor mounting structures corresponding to FIGS. 3 and 5, which used the multilayer capacitors of size 4532, did not see their ESL value increase compared to the capacitor mounting structure corresponding to FIG. 1 so long as their interval IN200 or IN300 was 6.0 mm or less.

Incidentally, considering that the existing mounters (mounting devices) used for mounting multilayer capacitors on circuit boards have a mounting accuracy of approx. ±0.05 mm, it is difficult to achieve an interval IN200 of 0.1 mm or less with the capacitor mounting structure corresponding to FIG. 3. Also, from the viewpoint of high-density mounting on circuit boards, it is unlikely that the interval IN200 is set to 3.0 mm or more for the capacitor mounting structure corresponding to FIG. 3. Accordingly, from a practical viewpoint, the interval IN200 in the capacitor mounting structure corresponding to FIG. 3 is preferably in the range of 0.2 to 2.0 mm.

On the other hand, considering that the circuit boards actually in use have a thickness of approx. 0.15 to 1.6 mm, minimum wiring thickness of around 0.02 mm, and solder or other joining material, it is difficult to achieve an interval IN300 of 0.1 mm or less with the capacitor mounting structure corresponding to FIG. 5, while it is unlikely that the interval IN300 is set to 3.0 mm or more for the capacitor mounting structure corresponding to FIG. 5. Accordingly, from a practical viewpoint, the interval IN300 in the capacitor mounting structure corresponding to FIG. 5 is preferably in the range of 0.2 to 2.0 mm.

Figure 7:
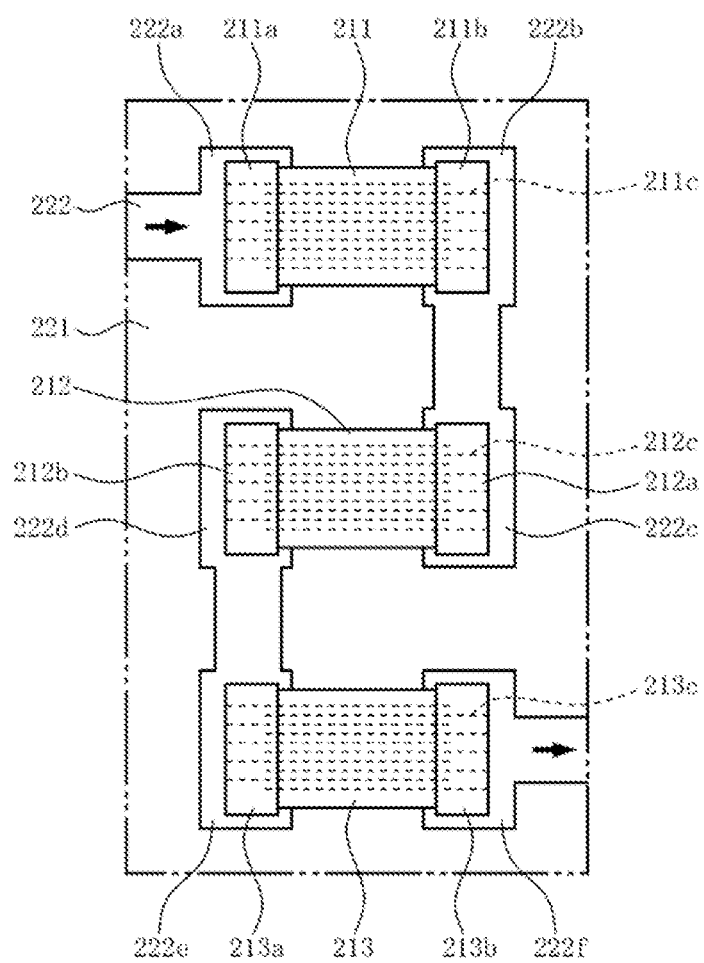
FIG. 7 is a drawing showing a variation example of the capacitor mounting structure shown in FIG. 3.

FIG. 7 shows a variation example of the capacitor mounting structure 200 shown in FIG. 3, or specifically a capacitor mounting structure constituted by three multilayer capacitors 211 to 213 of the same specification mounted on a circuit board 221 under series connection.

Just like the first multilayer capacitor 211 and second multilayer capacitor 212, the third multilayer capacitor 213 has external electrodes 213a, 213b on the opposing ends, respectively, with parts of multiple internal electrode layers 213c built into the capacitor body (not accompanied by symbol) connected to one external electrode 213a, and the remaining parts thereof connected to the other external electrode 213b. Provided in roughly a reverse S-shape on one surface of the circuit board 221 are wires 222 for series connection, where these wires 222 have six pads 222a to 222f.

As shown in FIG. 7, the first multilayer capacitor 211, second multilayer capacitor 212 and third multilayer capacitor 213 have a positional relationship based on parallel displacement in the "vertical direction" in FIG. 7, and the first multilayer capacitor 211 and second multilayer capacitor 212, and the second multilayer capacitor 212 and third multilayer capacitor 213, are apart from each other by an interval corresponding to the aforementioned interval IN200, respectively.

Just like the first multilayer capacitor 211 and second multilayer capacitor 212, the third multilayer capacitor 213 is oriented so that the internal electrode layers 213c lie roughly at right angles with one surface of the circuit board 221, and one external electrode 213a is connected to the pad 222e, while the other external electrode 213b is connected to the pad 222f. It should be noted that the aforementioned connections, for which solder or other joining material is used, are not illustrated. Also, the thick arrows in FIG. 7 indicate the flow directions of electric signals.

In other words, the series-connected first multilayer capacitor 211, second multilayer capacitor 212 and third multilayer capacitor 213 are placed in such a way that signals flow through the adjacent first multilayer capacitor 211 and second multilayer capacitor 212 in opposite directions, respectively, while signals flow through adjacent second multilayer capacitor 212 and third multilayer capacitor 213 in opposite directions, respectively. Additionally, with the series-connected first multilayer capacitor 211, second multilayer capacitor 212 and third multilayer capacitor 213, adjacent first multilayer capacitor 211 and second multilayer capacitor 212 are placed so that their respective internal electrode layers 211c, 212c face each other, while adjacent second multilayer capacitor 212 and third multilayer capacitor 213 are placed so that their respective internal electrode layers 212c, 213c face each other. This means that, even when the series connection length that includes these multilayer capacitors 211 to 213 (actual wiring length from the end face of the external electrode 211a on the first multilayer capacitor 211 to the end face of the external electrode 213b on the third multilayer capacitor 213) increases, mutual inductance can be reduced in an effective manner to prevent the overall ESL value from increasing.

Figure 8A:
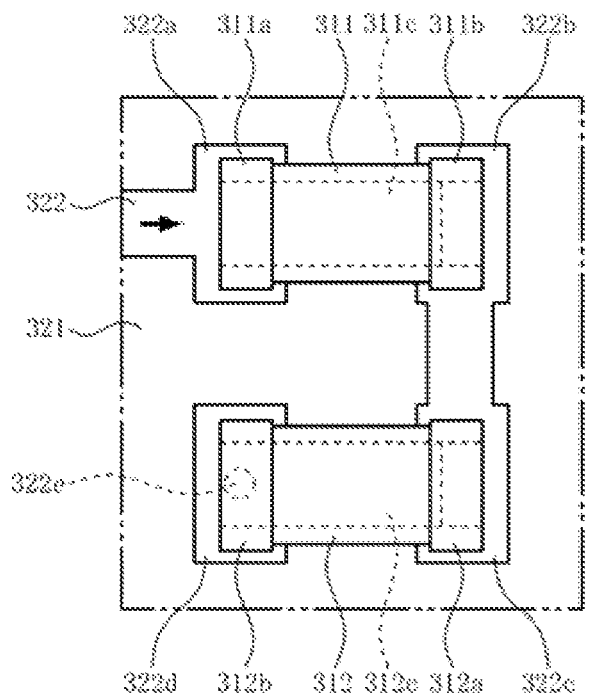
FIGS. 8A and 8B are drawings showing a variation example of the capacitor mounting structure shown in FIG. 5.
Figure 8B:
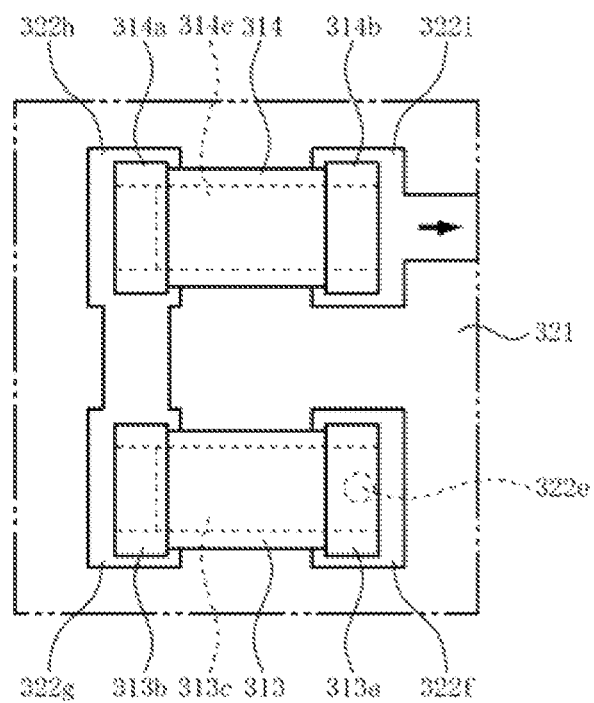

FIGS. 8A and 8B show a variation example of the capacitor mounting structure 300 shown in FIG. 5, or specifically a capacitor mounting structure constituted by four multilayer capacitors 311 to 314 of the same specification mounted on a circuit board 321 under series connection.

Just like the first multilayer capacitor 311 and second multilayer capacitor 312, the third multilayer capacitor 313 has external electrodes 313a, 313b on the opposing ends, respectively, with parts of multiple internal electrode layers 313c built into the capacitor body (not accompanied by symbol) connected to one external electrode 313a, and the remaining parts thereof connected to the other external electrode 313b. Also, the fourth multilayer capacitor 314 has external electrodes 314a, 314b on the opposing ends, respectively, with parts of multiple internal electrode layers 314c built into the capacitor body (not accompanied by symbol) connected to one external electrode 314a, and the remaining parts thereof connected to the other external electrode 314b. Provided in roughly a U-shape on one surface of the circuit board 321 are parts of wires 322 for series connection (refer to FIG. 8A), while provided in roughly a U-shape on the other side are the other parts of wires 322 for series connection (refer to FIG. 8B). These wires 322 have four pads 322a to 322d on one side, four pads 322f to 322i on the other side, and a via conductor 322e that connects the pad 322d on one side and the pad 322f on the other side.

As shown in FIGS. 8A and 8B, the first multilayer capacitor 311 and second multilayer capacitor 312 have a positional relationship based on parallel displacement in the "vertical direction" in FIG. 8A, while the third multilayer capacitor 313 and fourth multilayer capacitor 314 have a positional relationship based on parallel displacement in the "vertical direction" in FIG. 8B. Also, the first multilayer capacitor 311 and fourth multilayer capacitor 314 have a positional relationship based on parallel displacement in the thickness direction of the circuit board 321, while the second multilayer capacitor 312 and third multilayer capacitor 313 have a positional relationship based on parallel displacement in the thickness direction of the circuit board 321, where the first multilayer capacitor 311 and fourth multilayer capacitor 314, and the second multilayer capacitor 312 and third multilayer capacitor 313, are apart from each other by an interval corresponding to the aforementioned interval IN300, respectively.

The first multilayer capacitor 311 is oriented so that the internal electrode layers 311c lie roughly in parallel with one surface of the circuit board 321, and one external electrode 311a is connected to the pad 322a, while the other external electrode 311b is connected to the pad 322b. The second multilayer capacitor 312 is oriented so that the internal electrode layers 312c lie roughly in parallel with the one surface of the circuit board 321, and one external electrode 312a is connected to the pad 322c, while the other external electrode 312b is connected to the pad 322d. The third multilayer capacitor 313 is oriented so that the internal electrode layers 313c lie roughly in parallel with another surface of the circuit board 321, and one external electrode 313a is connected to the pad 322f, while the other external electrode 313b is connected to the pad 322g. The fourth multilayer capacitor 314 is oriented so that the internal electrode layers 314c lie roughly in parallel with the other surface of the circuit board 321, and one external electrode 314a is connected to the pad 322h, while the other external electrode 314b is connected to the pad 322i. It should be noted that the aforementioned connections, for which solder or other joining material is used, are not illustrated. Also, the thick arrows in FIGS. 8A and 8B indicate the flow directions of signals.

In other words, the series-connected first multilayer capacitor 311, second multilayer capacitor 312, third multilayer capacitor 313, and fourth multilayer capacitor 314 are placed in such a way that signals flow through the adjacent first multilayer capacitor 311 and second multilayer capacitor 312 in opposite directions, respectively, that signals flow through adjacent second multilayer capacitor 312 and third multilayer capacitor 313 in opposite directions, respectively, and that signals flow through adjacent third multilayer capacitor 313 and fourth multilayer capacitor 314 in opposite directions, respectively. In addition, among the series-connected first multilayer capacitor 311, second multilayer capacitor 312, third multilayer capacitor 313, and fourth multilayer capacitor 314, adjacent second multilayer capacitor 312 and third multilayer capacitor 313 are placed so that their respective internal electrode layers 312c, 313c face each other via the board 321, while first multilayer capacitor 311 and fourth multilayer capacitor 314 are also placed so that their respective internal electrode layers 311c, 314c face each other via the board 321. This means that, even when the series connection length that includes these multilayer capacitors 311 to 314 (actual wiring length from the end face of the external electrode 311a on the first multilayer capacitor 311 to the end face of the external electrode 314b on the fourth multilayer capacitor 314) increases, mutual inductance can be reduced in an effective manner to prevent the overall ESL value from increasing.

The foregoing illustrated, as embodiments, capacitor mounting structures constituted by two to four multilayer capacitors of the same specification mounted on a circuit board under series connection; however, an effect similar to that described above can also be achieved by a capacitor mounting structure constituted by multiple multilayer capacitors of different specifications mounted on a circuit board under series connection.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2016-080850, filed Apr. 14, 2016, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A capacitor mounting structure constituted by multiple multilayer capacitors mounted on a mounting face of a circuit board under series connection, each multilayer capacitor having two end faces opposing to each other wherein electrical signals flow through the multilayer capacitor in a signal direction from one of the two end faces to the other of the two end faces, wherein the multiple multilayer capacitors are placed in a manner such that adjacent multilayer capacitors are connected in series with respect to electrical signal flow and the signal directions of the adjacent multiple capacitors are opposite to each other.

2. A capacitor mounting structure according to claim 1, wherein the adjacent multilayer capacitors include a pair of multilayer capacitors placed in a manner such that internal electrode layers of the pair of multilayer capacitors extend in a direction orthogonal to the mounting face of the circuit board and their respective internal electrode layers face each other.

3. A capacitor mounting structure according to claim 1, wherein the multiple multilayer capacitors are mounted on one face of the circuit board.

4. A capacitor mounting structure according to claim 2, wherein the multiple multilayer capacitors are mounted on one face of the circuit board.

5. A capacitor mounting structure according to claim 1, wherein some of the multiple multilayer capacitors are mounted on one face of the circuit board, and others are mounted on another face of the circuit board.

6. A capacitor mounting structure according to claim 2, wherein some of the multiple multilayer capacitors are mounted on one face of the circuit board, and others are mounted on another face of the circuit board.

7. A capacitor mounting structure according to claim 1, wherein the adjacent multilayer capacitors are parallelly disposed and a distance between the adjacent multilayer capacitors is in a range of 0.2 mm to 2.0 mm.

* * * * *